United States Patent
Moriwaki et al.

(10) Patent No.: US 6,740,941 B2
(45) Date of Patent: May 25, 2004

(54) SEMICONDUCTOR DEVICE INCLUDING A GATE INSULATING FILM MADE OF HIGH-DIELECTRIC-CONSTANT MATERIAL

(75) Inventors: Masaru Moriwaki, Osaka (JP); Takayuki Yamada, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/323,636

(22) Filed: Dec. 20, 2002

(65) Prior Publication Data

US 2003/0087494 A1 May 8, 2003

Related U.S. Application Data

(62) Division of application No. 09/956,554, filed on Sep. 20, 2001, now Pat. No. 6,514,883.

(30) Foreign Application Priority Data

Sep. 20, 2000 (JP) ........................................ 2000-285674

(51) Int. Cl.[7] .................... H01L 29/94; H01L 29/76
(52) U.S. Cl. .................. 257/405; 257/406; 257/410; 257/288; 257/368
(58) Field of Search ................ 257/288, 368, 257/405, 406, 410, 411

(56) References Cited

U.S. PATENT DOCUMENTS

| | | | |
|---|---|---|---|
| 4,420,385 A | 12/1983 | Hartsough | |
| 5,738,771 A | 4/1998 | Yoshida | |
| 5,827,409 A | 10/1998 | Iwata et al. | |
| 6,123,986 A | 9/2000 | Machwitz et al. | |
| 6,146,927 A | * 11/2000 | Yamanaka | 438/149 |
| 6,291,867 B1 | 9/2001 | Wallace et al. | |
| 6,551,946 B1 | * 4/2003 | Chen et al. | 438/770 |
| 2002/0106536 A1 | 8/2002 | Lee et al. | |

* cited by examiner

Primary Examiner—Minhloan Tran
Assistant Examiner—Tan Tran
(74) Attorney, Agent, or Firm—Nixon Peabody LLP; Donald R. Studebaker

(57) ABSTRACT

A metal target, at least the surface region of which has been oxidized, is prepared in a chamber. Then, a sputtering process is performed on the metal target with an inert gas ambient created in the chamber, thereby depositing a first metal oxide film as a lower part of a gate insulating film over a semiconductor substrate. Next, a reactive sputtering process is performed on the metal target with a mixed gas ambient, containing the inert gas and an oxygen gas, created in the chamber, thereby depositing a second metal oxide film as a middle or upper part of the gate insulating film over the first metal oxide film.

12 Claims, 6 Drawing Sheets

SEMICONDUCTOR DEVICE INCLUDING A GATE INSULATING FILM MADE OF HIGH-DIELECTRIC-CONSTANT MATERIAL

BACKGROUND OF THE INVENTION

The present invention relates to a semiconductor device including a gate insulating film made of a material with a high dielectric constant (which will be herein referred to as a "high-dielectric-constant material") and also relates to a method for fabricating the device.

Recently, there has been a growing demand for high-speed-operating semiconductor devices. To meet this demand, the gate insulating film of MOSFETs has been further thinned for the purpose of increasing the drivability thereof.

However, if the gate insulating film is a thin film of $SiO_2$ (with a relative dielectric constant $\epsilon$ of 3.9), the gate leakage current increases noticeably because a tunneling current flows therethrough.

Thus, to prevent the gate leakage current from increasing while enhancing the drivability of MOSFETs, various methods for increasing the actual thickness of the gate insulating film and obtaining a desired gate capacitance have been researched. For example, according to one of those methods, the gate insulating film is made of a high-dielectric-constant material (high-$\kappa$ material) such as $HfO_2$ (hafnium dioxide with a relative dielectric constant $\epsilon$ of about 30) or $ZrO_2$ (zirconium dioxide with a relative dielectric constant $\epsilon$ of about 25).

To deposit a gate insulating film of a high-dielectric-constant material, a reactive sputtering process is performed using a target of Hf or Zr, for example, in a mixed gas ambient containing Ar (argon) and $O_2$ gases, for example. In this manner, a gate insulating film of a high-dielectric-constant material such as $HfO_2$ or $ZrO_2$ can be deposited over a semiconductor substrate.

However, if the gate insulating film of the high-dielectric-constant material is deposited over a silicon substrate by the reactive sputtering method, for example, the surface of the silicon substrate is oxidized by a plasma created from the $O_2$ gas during the reactive sputtering process. Thus, an unwanted silicon dioxide film is formed between the silicon substrate and gate insulating film. It should be noted that the unwanted film will be herein referred to as a "silicon dioxide film" but can actually be any other silicon oxide film with a non-stoichimetric composition. Consequently, the gate insulating film becomes a stack of the silicon dioxide film with a relatively low dielectric constant and the high-dielectric-constant film. As a result, the gate insulating film has its effective dielectric constant decreased as a whole.

That is to say, the known method for fabricating a semi-conductor device cannot obtain the desired gate capacitance. Thus, it is difficult to enhance the drivability of MOSFETs.

FIG. 7 is a cross-sectional view showing the known method for fabricating a semiconductor device.

As shown in FIG. 7, a target 80 of Zr is placed in a chamber (not shown) and a silicon substrate 90 is loaded thereto. Then, a reactive sputtering process is performed using the target 80 with a mixed gas ambient containing Ar and $O_2$ gases created in the chamber. During this process, the surface of the target 80 is oxidized, thereby forming a Zr oxide layer 81 thereon. At the same time, the surface of the silicon substrate 90 is also oxidized to be covered with a silicon dioxide film 91. Further, as a result of the reactive sputtering process, a Zr oxide film 92 is formed over the silicon substrate 90 with the silicon dioxide film 91 interposed therebetween. Accordingly, the resultant gate insulating film becomes a stack of the silicon dioxide film 91 and Zr oxide film 92. As a result, the gate capacitance decreases compared to a gate insulating film that has the same thickness but consists essentially of a Zr oxide film alone.

SUMMARY OF THE INVENTION

It is therefore an object of the present invention to enhance the drivability of MOSFETs by getting a gate insulating film, consisting essentially of a high-dielectric-constant material alone, formed by a sputtering process without allowing any silicon dioxide film to exist on the surface of a semiconductor substrate.

An inventive method for fabricating a semiconductor device includes the steps of: a) preparing a metal target in a chamber, at least a surface region of the target having been oxidized; b) performing a sputtering process using the metal target with an inert gas ambient created in the chamber, thereby depositing a first metal oxide film as a lower part of a gate insulating film over a semiconductor substrate; and c) performing a reactive sputtering process on the metal target with a mixed gas ambient, containing the inert gas and an oxygen gas, created in the chamber, thereby depositing a second metal oxide film as a middle or upper part of the gate insulating film over the first metal oxide film.

According to the inventive method, in the step of depositing a first metal oxide film over a semiconductor substrate, i.e., the initial stage of a process for forming a gate insulating film, no reactive sputtering process is performed but a sputtering process is performed using a metal target, at least the surface region of which has been oxidized, in an ambient containing no oxygen gas. Thus, the first metal oxide film can be deposited over the semiconductor substrate without allowing any silicon dioxide film to exist on the surface of the semiconductor substrate. Also, in the step of depositing a second metal oxide film over the first metal oxide film, i.e., after the initial stage of the process for forming the gate insulating film is over, a reactive sputtering process is performed in an ambient containing an oxygen gas with the surface of the semiconductor substrate covered with the first metal oxide film. Thus, the second metal oxide film can be deposited over the first metal oxide film without allowing any silicon dioxide film to exist on the surface of the semiconductor substrate. Accordingly, the gate insulating film can be essentially made up of the first and second metal oxide films alone. In other words, a gate insulating film consisting essentially of a high-dielectric-constant material alone can be formed. As a result, the resultant MOSFET can have its gate capacitance increased and its drivability enhanced. In addition, a gate leakage current can be minimized because the gate insulating film can be thick enough with a desired gate capacitance maintained.

In one embodiment of the present invention, the step a) may include the step of performing a provisional reactive sputtering process on the metal target to be oxidized with a mixed gas ambient, containing the inert and oxygen gases, created in the chamber, thereby oxidizing the surface region of the metal target before the semiconductor substrate is loaded into the chamber.

Then, the metal target with the oxidized surface region can be prepared easily.

In this particular embodiment, the provisional reactive sputtering process is preferably performed on another semiconductor substrate that has been loaded into the chamber before the step a) is started.

Then, no insulating metal oxide is deposited on a wafer stage (which will be used as a gas-discharge electrode during the subsequent sputtering process steps) in the chamber when the surface region of the metal target is oxidized. As a result, it is possible to avoid the inability to apply a voltage to the semiconductor substrate in the subsequent process steps.

In another embodiment, the step c) may include the step of introducing the oxygen gas into the chamber with the inert gas, used in the step b), left in the chamber and with a gas-discharge continued from the step b) to carry out the reactive sputtering process.

Then, the steps b) and c) of depositing the first and second metal oxide films can be performed continuously. As a result, the throughput of the process improves.

In an alternative embodiment, the inventive method may further include, between the steps b) and c), the step of introducing the oxygen gas into the chamber with the inert gas, used in the step b), left in the chamber and with a gas-discharge for the sputtering process suspended.

Then, the mixture ratio of the inert and oxygen gases can be fixed before the step c) of depositing the second metal oxide film is started. As a result, the oxygen concentration of the second metal oxide film is controllable more easily.

In another alternative embodiment, the inventive method may further include, between the steps b) and c), the step of exhausting the inert gas, used in step b), from the chamber and then newly introducing the inert gas along with the oxygen gas into the chamber with a gas-discharge for the sputtering process suspended.

Then, the mixture ratio of the inert and oxygen gases should be fixed before the step c) of depositing the second metal oxide film is started. As a result, the oxygen concentration of the second metal oxide film is controllable much more easily.

In yet another embodiment, the step c) may include the step of supplying the oxygen gas at a controlled flow rate into the chamber to deposit the second metal oxide film with a different oxygen concentration from that of the first metal oxide film.

Then, the structure of the gate insulating film can be optimized with the reliability and the dielectric constant of the gate insulating film both taken into account. As a result, a highly reliable, high-performance MOSFET is realized.

An inventive semiconductor device includes a gate insulating film that includes: a first metal oxide film deposited on a semiconductor substrate; and a second metal oxide film deposited on the first metal oxide film. In this device, the first and second metal oxide films are made of the same type of metal oxide and have mutually different oxygen concentrations.

In the inventive device, the structure of the gate insulating film has been optimized with the reliability and the dielectric constant of the gate insulating film both taken into account. Thus, the device is implementable as a highly reliable, high-performance MOSFET.

DESCRIPTION OF THE PREFERRED EMBODIMENTS

Embodiment 1

Hereinafter, a semiconductor device and a method for fabricating the device according to a first embodiment of the present invention will be described as being applied to an NMOSFET with reference to the drawings.

FIGS. 1A through 1D are cross-sectional views showing respective process steps for fabricating a semiconductor device according to the first embodiment. In this method, a sputtering system of a single wafer processing type is used.

Figure 1A:
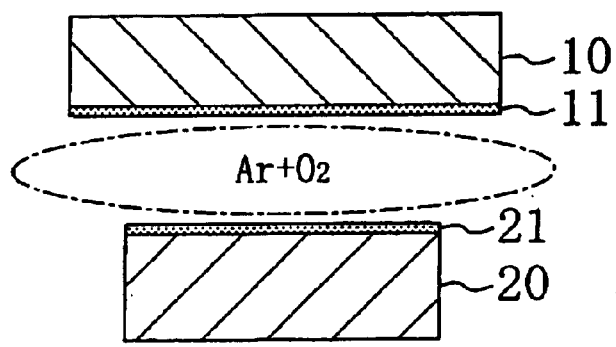
FIGS. 1A through 1D are cross-sectional views showing respective process steps of a semiconductor device fabricating method according to a first embodiment of the present invention.

First, as shown in FIG. 1A, a target 10 of Zr is placed in a chamber (not shown) and a dummy silicon substrate 20 is loaded thereto. Then, a reactive sputtering process is provisionally performed using the Zr target 10 with a mixed gas ambient containing Ar and $O_2$ gases created in the chamber. In this manner, a Zr oxide layer 11 having a thickness of about 5 nm to about 10 nm is formed in the surface region of the Zr target 10. In the meantime, a Zr oxide film 21 is deposited to a thickness of about 10 nm to about 100 nm over the dummy silicon substrate 20.

Next, the dummy silicon substrate 20 is unloaded out of the chamber. At this time, the surface of the Zr target 10 is not cleaned by sputtering performed in an Ar gas ambient, for example. Thus, the Zr oxide layer 11 remains in the surface of the Zr target 10.

Figure 1B:
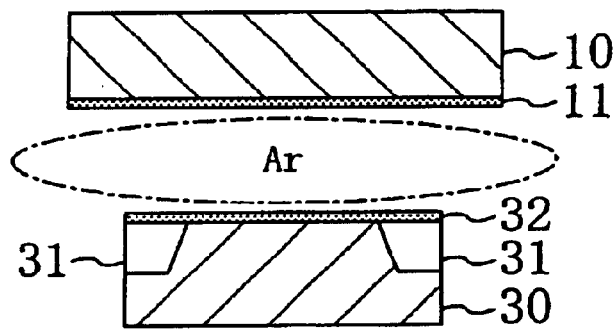

Then, as shown in FIG. 1B, a p-silicon substrate 30 is loaded into the chamber. In this case, an isolation region 31 has been defined beforehand in the surface of the p-silicon substrate 30 by a known method.

After that, a sputtering process is performed using the Zr target 10, including the Zr oxide layer 11 in its surface region, for about three seconds with an Ar gas ambient created in the chamber. In this manner, a first Zr oxide film 32 is deposited to a thickness of about 1 to 2 nm over the p-silicon substrate 30. In this process step, the Zr oxide layer 11 in the surface of the Zr target 10 is subjected to the sputtering process, thereby depositing the first Zr oxide film 32 over the substrate 30. Thus, the first Zr oxide film 32 can be deposited without performing a reactive sputtering process in an ambient containing an $O_2$ gas. Accordingly, no silicon dioxide film will be formed between the p-silicon substrate 30 and first Zr oxide film 32. In addition, since the first Zr oxide film 32 has a thickness of at most about 1 to 2 nm, the Zr oxide layer 11 still remains in the surface of the Zr target 10 even after the first Zr oxide film 32 has been deposited.

Figure 1C:
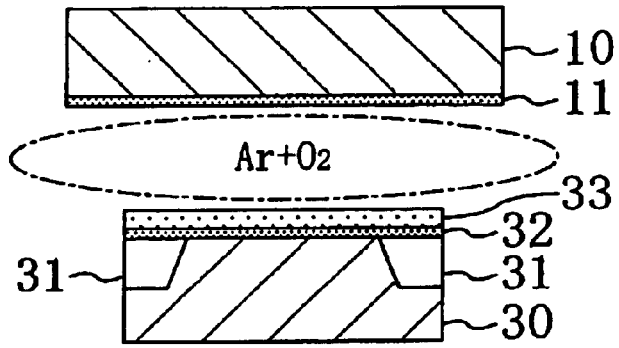

Subsequently, the gas discharge is continued for the sputtering purpose from the process step shown in FIG. 1B (which will be herein referred to as the "first Zr oxide deposition step"), while an $O_2$ gas is introduced into the chamber with the Ar gas, which has been used for the first Zr oxide deposition step, left in the chamber. Then, as shown in FIG. 1C, a reactive sputtering process can be performed using the Zr target 10 with a mixed gas ambient containing Ar and $O_2$ gases created in the chamber. As a result, a second Zr oxide film 33 is deposited to a thickness of about 3 to 5 nm over the first Zr oxide film 32. That is to say, the first Zr oxide deposition step and the process step shown in FIG. 1C (which will be herein referred to as the "second Zr oxide deposition step") can be performed continuously.

In the first embodiment, the second Zr oxide film 33 is deposited to have the same oxygen concentration as the first Zr oxide film 32 by controlling the flow rate of the $O_2$ gas during the second Zr oxide deposition step, for example. Specifically, $ZrO_2$ films with the stoichimetric composition, for example, may be deposited as the first and second Zr oxide films 32 and 33 so that the oxygen concentrations of the first and second Zr oxide films 32 and 33 are equal to each other, i.e., about 66 at %.

Then, the p-silicon substrate 30 is unloaded out of the chamber. At this time, the surface of the Zr target 10 is not cleaned by a sputtering process performed in an Ar gas ambient, for example. Thus, the Zr oxide layer 11 remains on the surface of the Zr target 10. Accordingly, process steps similar to the first and second Zr oxide deposition steps can be performed without performing the process step shown in FIG. 1A (which will be herein referred to as a "target oxidation step"). That is to say, after at least one dummy silicon wafer has been subjected to the target oxidation step using a sputtering system of a single wafer processing type, Zr oxide films to be a gate insulating film can be deposited over multiple silicon wafers numerous times without allowing any silicon dioxide film to exist under the Zr oxide films. Accordingly, it is possible to form the gate insulating film consisting essentially of the high-dielectric-constant material alone while minimizing the time for performing various process steps other than the steps of forming the gate insulating film and the number of dummy wafers. That is to say, the gate insulating film consisting essentially of the high-dielectric-constant material alone can be formed at a high throughput and at a low cost.

Figure 1D:
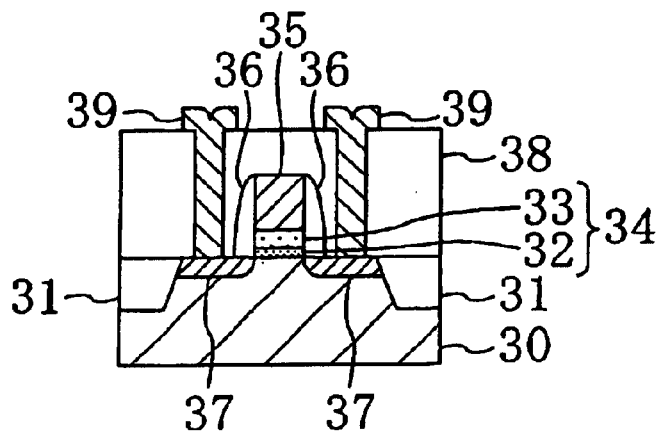

After that, as shown in FIG. 1D, a gate electrode 35 is formed over the p-silicon substrate 30 with the gate insulating film 34, made up of the first and second Zr oxide films 32 and 33, interposed therebetween. Then, an insulating sidewall 36 is formed on the side faces of the gate electrode 35. Subsequently, a doped layer 37 to be source/drain regions is defined in the surface regions of the p-silicon substrate 30. Thereafter, an interlevel dielectric film 38 is deposited over the p-silicon substrate 30 as well as over the gate electrode 35. Then, interconnects 39 including plugs, which are formed in the interlevel dielectric film 38 and connected to the doped layer 37, are formed on the interlevel dielectric film 38, thereby completing an NMOSFET.

Figure 2:
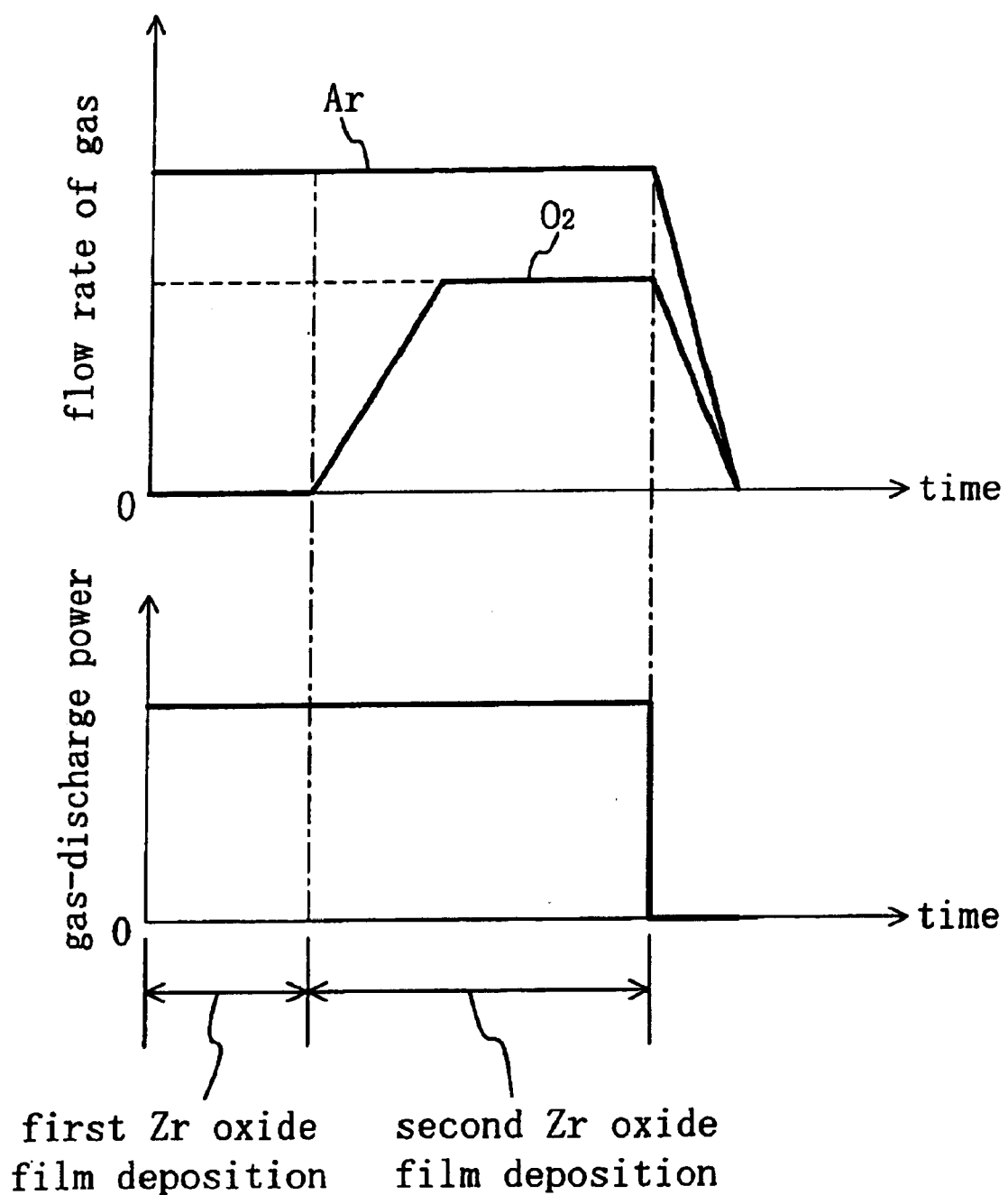
FIG. 2 shows variations in flow rates of Ar and $O_2$ gases with time and a variation in gas-discharge power for sputtering with time in the method of the first embodiment.

FIG. 2 shows variations in flow rates of Ar and $O_2$ gases with time and a variation in gas-discharge power for sputtering with time for an interval starting from the first Zr oxide deposition step and ending with the second Zr oxide deposition step in the method of the first embodiment.

As shown in FIG. 2, the flow rate of the Ar gas is kept constant from the start point of the first Zr oxide deposition step through the end point of the second Zr oxide deposition step. On the other hand, the $O_2$ gas starts to be introduced at the end point of the first Zr oxide deposition step, i.e., the start point of the second Zr oxide deposition step. Then, after the flow rate of the $O_2$ gas has reached a predetermined value (i.e., the mixture ratio of the Ar and $O_2$ gases is fixed), the flow rate of the $O_2$ gas will be kept constant until the second Zr oxide deposition step is over. In this case, the mixture ratio of the Ar and $O_2$ gases (in the steady state) is not limited to a particular value. For example, the ratio of the flow rate of the Ar gas to that of the $O_2$ gas may range from about 7:3 to about 1:9.

As also shown in FIG. 2, the gas-discharge power for sputtering is kept constant from the start point of the first Zr oxide deposition step through the end point of the second Zr oxide deposition step.

It should be noted that when the second Zr oxide deposition step is over, the Ar and $O_2$ gases are both exhausted from the chamber and the gas-discharge for sputtering is stopped.

In the first embodiment, the flow rate of the $O_2$ gas is relatively low at the initial stage of the second Zr oxide deposition step (see FIG. 2). However, since the Zr oxide layer 11 has been formed in the surface region of the Zr target get 10, the lower part of the second Zr oxide film 33 can also have a predetermined oxygen concentration through the sputtering of the Zr oxide layer 11. Accordingly, the oxygen concentration of the second Zr oxide film 33 can be uniformized in the thickness direction.

Also, in the first embodiment, oxygen defects might exist in the first Zr oxide film 32 at the start point of the second Zr oxide deposition step. However, these oxygen defects disappear when exposed to a plasma created from the $O_2$ gas during the second Zr oxide deposition step. Thus, the quality of the first Zr oxide film 32 does not degrade.

Figure 3:
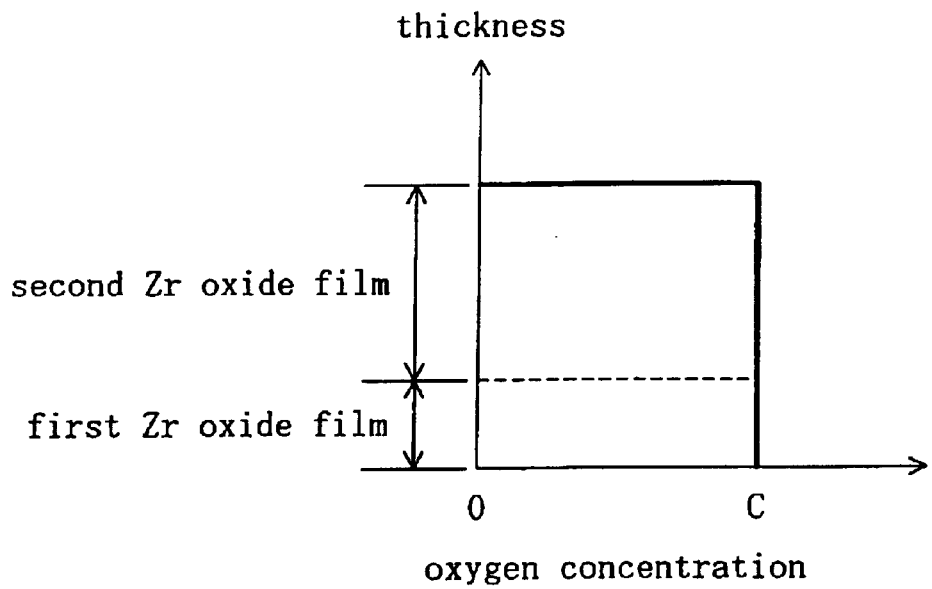
FIG. 3 is a graph showing the oxygen concentration in the thickness direction of Zr oxide films deposited by the method of the first embodiment.

FIG. 3 shows the oxygen concentration in the thickness direction of the first and second Zr oxide films 32 and 33 formed by the method of the first embodiment. In FIG. 3, the thickness is measured from the surface of the p-type silicon substrate 30.

As shown in FIG. 3, the first and second Zr oxide films 32 and 33 have the same oxygen concentration. Specifically, the oxygen concentration of the films 32 and 33 is set equal to a predetermined value C (which is uniform in the thickness direction).

As described above, according to the first embodiment, a sputtering process is performed using a Zr target 10, including a Zr oxide layer 11 in its surface region, with an Ar gas ambient created in a chamber. In this manner, a first Zr oxide film 32 to be the lower part of a gate insulating film 34 is deposited over a p-silicon substrate 30. After that, a reactive sputtering process is performed using the same Zr target with a mixed gas ambient containing Ar and $O_2$ gases created in the chamber. In this manner, a second Zr oxide film 33 to be the middle or upper part of the gate insulating film 34 is deposited over the first Zr oxide film 32. Accordingly, in the first Zr oxide deposition step, i.e., the initial stage of the process for forming the gate insulating film, no reactive sputtering process is performed but a sputtering process is performed using the Zr target 10, including the Zr oxide layer 11 in its surface region, in an ambient containing no $O_2$ gas. As a result, the first Zr oxide film 32 can be deposited over the p-silicon substrate 30 without allowing any silicon dioxide film to exist on the surface of the p-silicon substrate 30. In the second Zr oxide deposition step, i.e., after the initial stage of the process for forming the gate insulating film is over, a reactive sputtering process is performed in an ambient containing an $O_2$ gas with the surface of the p-silicon substrate 30 covered with the first Zr oxide film 32. Thus, the second Zr oxide film 33 can be deposited over the first Zr oxide film 32 without allowing any silicon dioxide film to exist on the surface of the p-silicon substrate 30. Accordingly, the gate insulating film can be essentially made up of the first and second Zr oxide films 32 and 33 alone. In other words, a gate insulating film consisting essentially of a high-dielectric-constant material alone can be formed. As a result, the resultant MOSFET can have its gate capacitance increased and its drivability enhanced. Furthermore, a gate leakage current can be minimized because the gate insulating film can be thick enough with a desired gate capacitance maintained.

Also, according to the first embodiment, before the p-silicon substrate 30 is loaded into the chamber, a reactive sputtering process is performed provisionally using an unoxidized Zr target 10 with a mixed gas ambient containing Ar and $O_2$ gases created in the chamber. In this manner, the surface region of the Zr target 10 can be oxidized easily. In this process step, the provisional reactive sputtering is performed on a dummy silicon substrate 20 that has been loaded into the chamber beforehand. Thus, no insulating Zr oxide is deposited on a wafer stage (which will be used as a gas-discharge electrode during the sputtering process) in the chamber when the Zr target 10 is oxidized. As a result, it is possible to avoid the inability to apply a voltage to the p-silicon substrate 30 in subsequent process steps.

In addition, according to the first embodiment, the second Zr oxide deposition step includes the step of continuing the gas discharge for the sputtering purpose from the first Zr oxide deposition step, while introducing an $O_2$ gas into the chamber with the Ar gas, used for the first Zr oxide de-deposition step, left in the chamber. Accordingly, the first and second Zr oxide deposition steps can be performed continuously. As a result, the throughput of the process improves.

In the first embodiment, the Ar gas is used as an inert gas. However, the same effects are attainable even if Xe (xenon) or any other inert gas is used instead of Ar gas.

Also, in the first embodiment, the Zr target 10 is used. Alternatively, any other metal such as Hf, La, Ta or Al, which can produce an oxide with a high dielectric constant through a reactive sputtering process, may be used for the target because similar effects are achieved with any of these metals.

Further, in the first embodiment, the Zr oxide layer 11 is formed in the surface region of the Zr target 10 by performing the reactive sputtering process provisionally using the unoxidized Zr target 10 with the mixed gas ambient containing the Ar and $O_2$ gases created in the chamber. Alternatively, a target of a metal such as Zr, at least the surface region of which has been oxidized, may be prepared in the chamber.

In addition, in the first embodiment, Zr oxide films are supposed to make up the gate insulating film 34. Alternatively, a Zr oxide film containing Si or any other metal oxide film containing Si may be used as the gate insulating film 34. Then, the lattice strain created in part of the p-silicon substrate 30 in contact with the gate insulating film 34 can be relaxed. As a result, decrease in carrier mobility can be suppressed. In this case, Si may be added to a metal oxide film such as Zr oxide film to be the gate insulating film by performing a reactive sputtering process using a metal target of, e.g., Zr containing Si. Alternatively, a reactive sputtering process may be performed using a target of Si as well as a target of a metal such as Zr.

Furthermore, in the first embodiment, the oxygen concentration of the second Zr oxide film 33 is controlled by adjusting the flow rate of the $O_2$ gas in the second Zr oxide deposition step. But the oxygen concentration of the first Zr oxide film 32 may be controlled by adjusting the flow rate of the $O_2$ gas during the target oxidation step (the process step shown in FIG. 1A), i.e., by adjusting the oxygen concentration of the Zr oxide layer 11 formed in the surface region of the Zr target 10.

Modified Example of Embodiment 1

Hereinafter, a semiconductor device and a method for fabricating the device according to a modified example of the first embodiment of the present invention will be described with reference to the drawings.

The method of this modified example is different from the method of the first embodiment in the oxygen concentrations of the first and second Zr oxide films 32 and 33.

Specifically, in the first embodiment, the second Zr oxide film 33 is deposited to have the same oxygen concentration as that of the first Zr oxide film 32 as shown in FIG. 3, for example.

On the other hand, in the modified example of the first embodiment, the second Zr oxide film 33 is deposited to have a different oxygen concentration from that of the first Zr oxide film 32 by controlling the flow rate of the $O_2$ gas during the second Zr oxide deposition step, for example.

Figure 4:
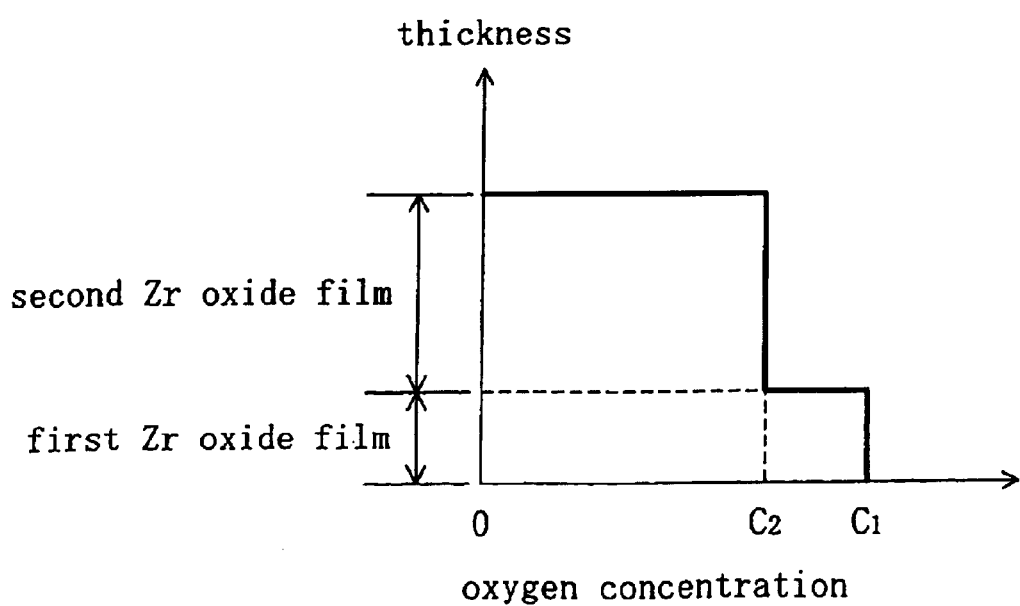
FIG. 4 is a graph showing the oxygen concentrations in the thickness direction of Zr oxide films deposited by a semiconductor device fabricating method according to a modified example of the first embodiment.

FIG. 4 shows the oxygen concentrations in the thickness direction of the first and second Zr oxide films 32 and 33 deposited by the method of the modified example of the first embodiment. In FIG. 4, the thickness is measured from the surface of the p-type silicon substrate 30.

As shown in FIG. 4, the first Zr oxide film 32 has an oxygen concentration higher than that of the second Zr oxide film 33. Specifically, the oxygen concentration of the first Zr oxide film 32 is set to a first predetermined value C1 (which is constant in the thickness direction). On the other hand, the oxygen concentration of the second Zr oxide film 33 is set to a second predetermined value C2, which is also constant in the thickness direction. In this case, C1>C2.

According to the modified example of the first embodiment, the following effects are attained as well as those obtained by the method of the first embodiment.

Specifically, the second Zr oxide film 33 is deposited to have a different oxygen concentration from that of the first Zr oxide film 32 by controlling the flow rate of the $O_2$ gas during the second Zr oxide deposition step. Thus, the structure of the resultant gate insulating film 34, made up of the first and second Zr oxide films 32 and 33, can be optimized with the reliability and the dielectric constant of the gate insulating film 34 both taken into account. As a result, a highly reliable, high-performance MOSFET is realized.

In this modified example, the first Zr oxide film 32 has an oxygen concentration higher than that of the second Zr oxide film 33 as shown in FIG. 4. Alternatively, the oxygen concentration of the first Zr oxide film 32 may be lower than that of the second Zr oxide film 33.

Further, in this example, the oxygen concentration of the second Zr oxide film 33 is controlled by adjusting the flow rate of the $O_2$ gas during the second Zr oxide deposition step. But the oxygen concentration of the first Zr oxide film 32 may be controlled by adjusting the flow rate of the $O_2$ gas during the target oxidation step, i.e., by adjusting the oxygen concentration of the Zr oxide layer 11 formed in the surface region of the Zr target 10.

Embodiment 2

Hereinafter, a semiconductor device and a method for fabricating the device according to a second embodiment of the present invention will be described with reference to the drawings.

The method of the second embodiment is different from the method of the first embodiment in when the second Zr oxide deposition step (see FIG. 1C) is started after the first Zr oxide deposition step (see FIG. 1B) is over.

Specifically, in the first embodiment shown in FIG. 2, even after the first Zr oxide deposition step is over, the gas-discharge is continued for the sputtering purpose, while the $O_2$ gas is introduced into the chamber with the Ar gas, which has been used for the first Zr oxide deposition step, left in the chamber. In this manner, the second Zr oxide deposition step, or the process step of depositing the second Zr oxide film 33 over the first Zr oxide film 32, is performed. That is to say, in the first embodiment, the first and second Zr oxide deposition steps are performed continuously.

On the other hand, in the second embodiment, the gas-discharge for sputtering is suspended during the interval between the first and second Zr oxide deposition steps. In the meantime, the $O_2$ gas is introduced into the chamber with the Ar gas, which has been used for the first Zr oxide deposition step, left in the chamber. In this case, the gas-discharge is suspended until the flow rate of the $O_2$ gas introduced into the chamber reaches, and settles at a predetermined value, e.g., for about 10 to 15 seconds. When the flow rate of the $O_2$ gas reaches the predetermined value, i.e., when the mixture ratio of the Ar and $O_2$ gases is fixed, the gas-discharge is resumed, thus starting the second Zr oxide deposition step. That is to say, in the second embodiment, a no discharge interval for changing the ambient in the chamber is placed between the first and second Zr oxide deposition steps.

Figure 5:
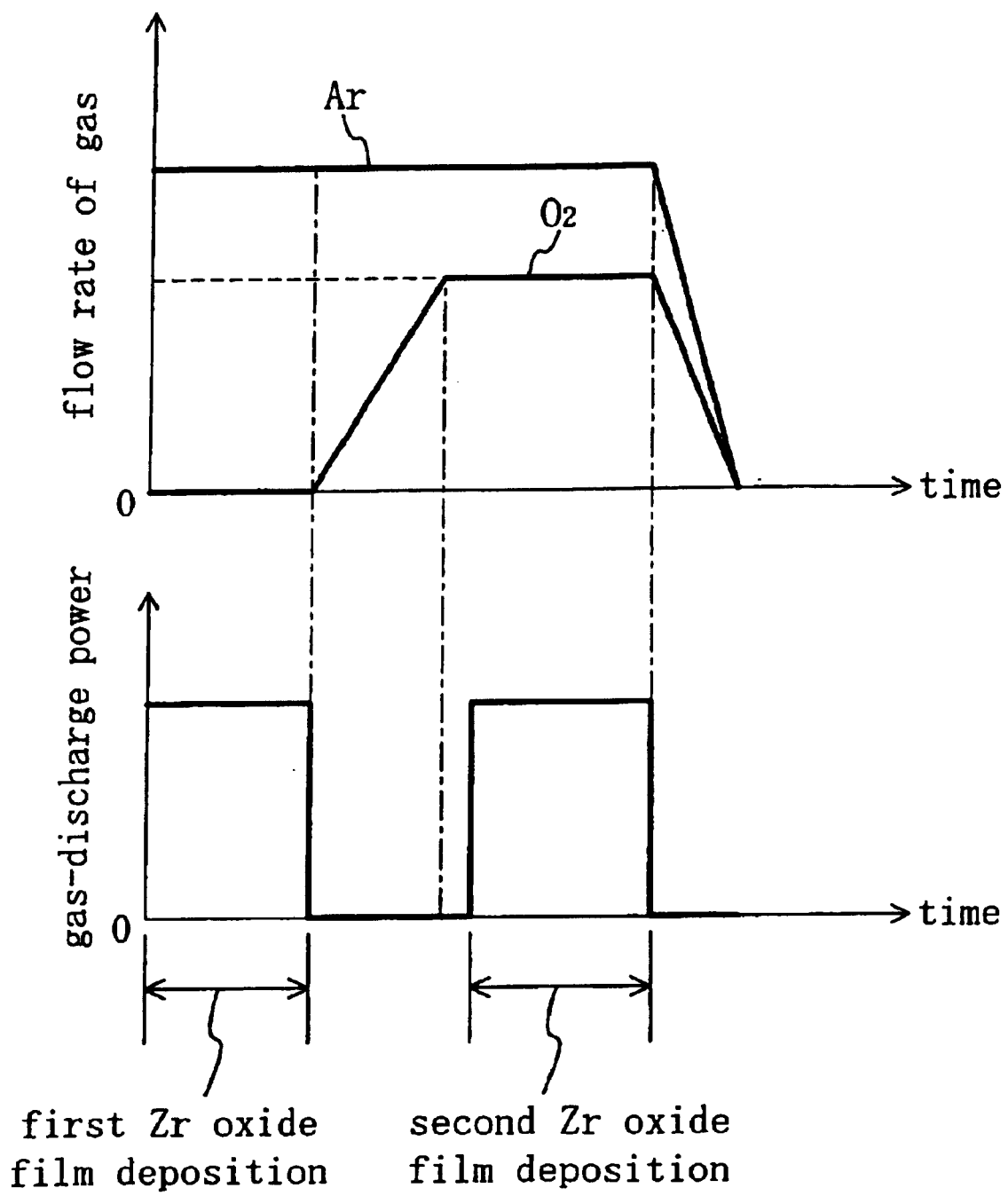
FIG. 5 shows variations in flow rates of Ar and $O_2$ gases with time and a variation in gas-discharge power for sputtering with time in a semiconductor device fabricating method according to a second embodiment of the present invention.

FIG. 5 shows variations in flow rates of the Ar and $O_2$ gases with time and a variation in gas-discharge power for sputtering with time for an interval starting from the first Zr oxide deposition step and ending with the second Zr oxide deposition step in the method of the second embodiment.

As shown in FIG. 5, the flow rate of the Ar gas is kept constant from the beginning of the first Zr oxide deposition step through the end of the second Zr oxide deposition step. On the other hand, the $O_2$ gas starts to be introduced when the first Zr oxide deposition step is over. Then, on and after the mixture ratio of the Ar and $O_2$ gases is fixed at the start point of the second Zr oxide deposition step, the flow rate of the $O_2$ gas will be kept constant until the second Zr oxide deposition step is over. In this case, the mixture ratio of the Ar and $O_2$ gases (in the steady state) is not limited to any particular value. For example, the ratio of the flow rate of the Ar gas to that of the $O_2$ gas may range from about 7:3 to about 1:9.

As also shown in FIG. 5, the gas-discharge power for sputtering is kept constant while each of the first and second Zr oxide deposition steps is being performed. But the gas-discharge power is kept off (i.e., reduced to zero) for the interval between the first and second Zr oxide deposition steps.

It should be noted that when the second Zr oxide deposition step is over, the Ar and $O_2$ gases are both exhausted from the chamber and the gas-discharge for sputtering is stopped.

According to the second embodiment, the following effects are attained as well as those obtained by the first embodiment.

Specifically, in the interval between the first and second Zr oxide deposition steps, the gas-discharge for sputtering is suspended, while the $O_2$ gas is introduced into the chamber with the Ar gas, which has been used for the first Zr oxide deposition step, left in the chamber. Thus, the mixture ratio of the Ar and $O_2$ gases can be fixed before the second Zr oxide deposition step is started. As a result, the oxygen concentration of the second Zr oxide film 33 is controllable more easily.

For the second embodiment, the first and second Zr oxide films 32 and 33 may have the same oxygen concentration as in the first embodiment (see FIG. 3). Alternatively, as in the modified example of the first embodiment, the first and second Zr oxide films 32 and 33 may have mutually different oxygen concentrations (see FIG. 4).

Embodiment 3

Hereinafter, a semiconductor device and a method for fabricating the device according to a third embodiment of the present invention will be described with reference to the drawings.

The method of the third embodiment is different from that of the first embodiment in the following two respects. Firstly, the second Zr oxide deposition step (see FIG. 1C) is started at a different time after the first Zr oxide deposition step (see FIG. 1B) is over. Secondly, the mixture of the Ar and $O_2$ gases is produced in a different manner for the second Zr oxide deposition step.

Specifically, in the first embodiment shown in FIG. 2, even after the first Zr oxide deposition step is over, the gas-discharge is continued for the sputtering purpose, while the $O_2$ gas is introduced into the chamber with the Ar gas, which has been used for the first Zr oxide deposition step, left in the chamber. In this manner, the second Zr oxide deposition step, or the process step of depositing the second Zr oxide film 33 over the first Zr oxide film 32, is performed. That is to say, in the first embodiment, the first and second Zr oxide deposition steps are performed continuously. In addition, the Ar gas that has been used for the first Zr deposition step is reused as part of the mixture for use in the second Zr oxide deposition step.

On the other hand, in the third embodiment, the gas-discharge for sputtering is suspended during the interval between the first and second Zr oxide deposition steps. In the meantime, the Ar gas that has been used for the first Zr deposition step is exhausted from the chamber, and then an Ar gas is newly introduced along with the $O_2$ gas into the chamber. In this case, the gas-discharge is suspended until the respective flow rates of the Ar and $O_2$ gases introduced into the chamber reach, and are settled at, predetermined values (which may be mutually different), e.g., for about 10 to 15 seconds. When the flow rates of the Ar and $O_2$ gases reach the predetermined values, i.e., when the mixture ratio of the Ar and $O_2$ gases is fixed, the gas-discharge is resumed, thus starting the second Zr oxide deposition step. That is to say, in the third embodiment, a no discharge interval for changing the ambient in the chamber is placed between the first and second Zr oxide deposition steps. In addition, the Ar gas is newly introduced as part of the mixture for use in the second Zr oxide deposition step without reusing the Ar gas that has been used for the first Zr oxide deposition step.

Figure 6:
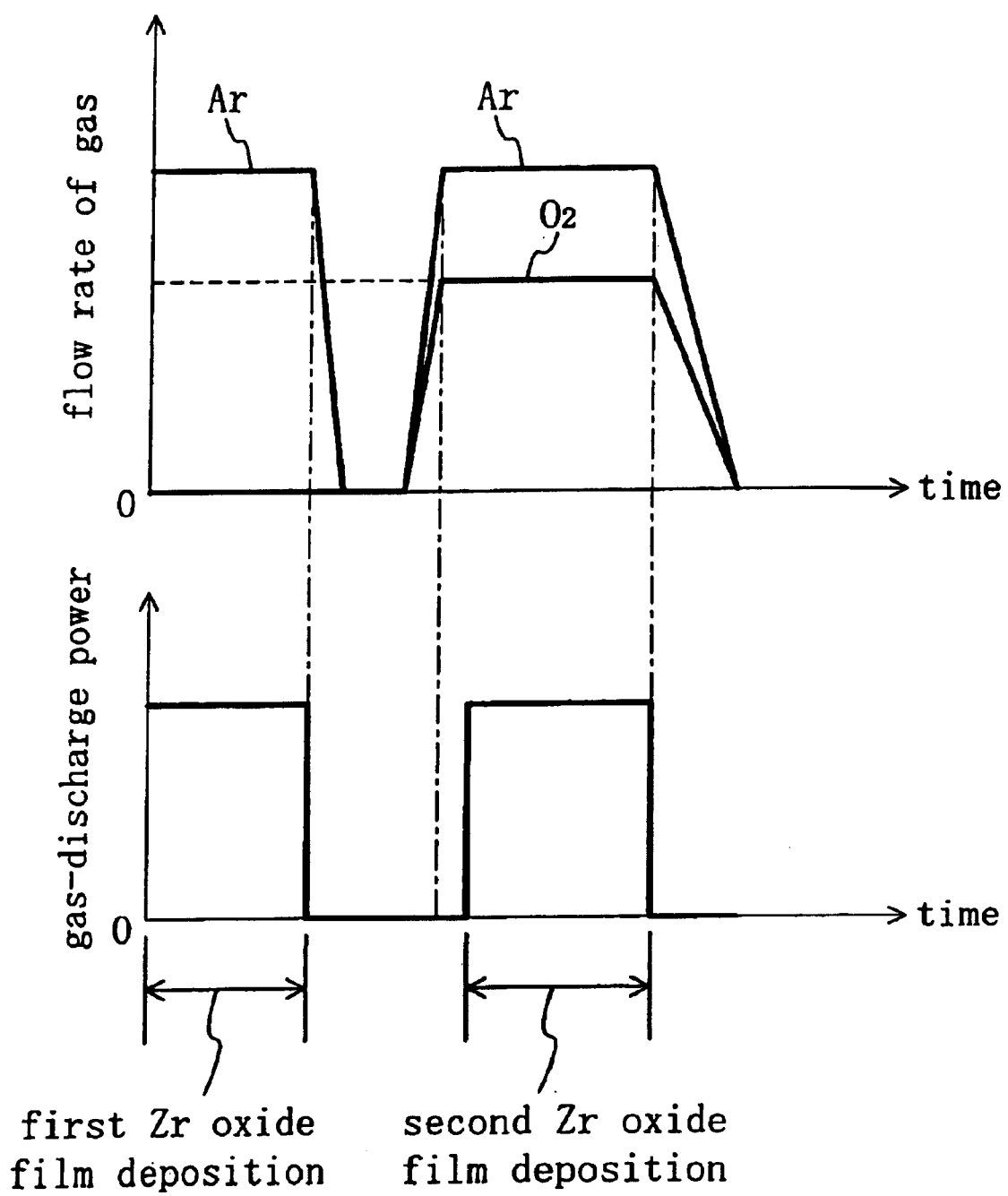
FIG. 6 shows variations in flow rates of Ar and $O_2$ gases with time and a variation in gas-discharge power for sputtering with time in a semiconductor device fabricating method according to a third embodiment of the present invention.
Figure 7:
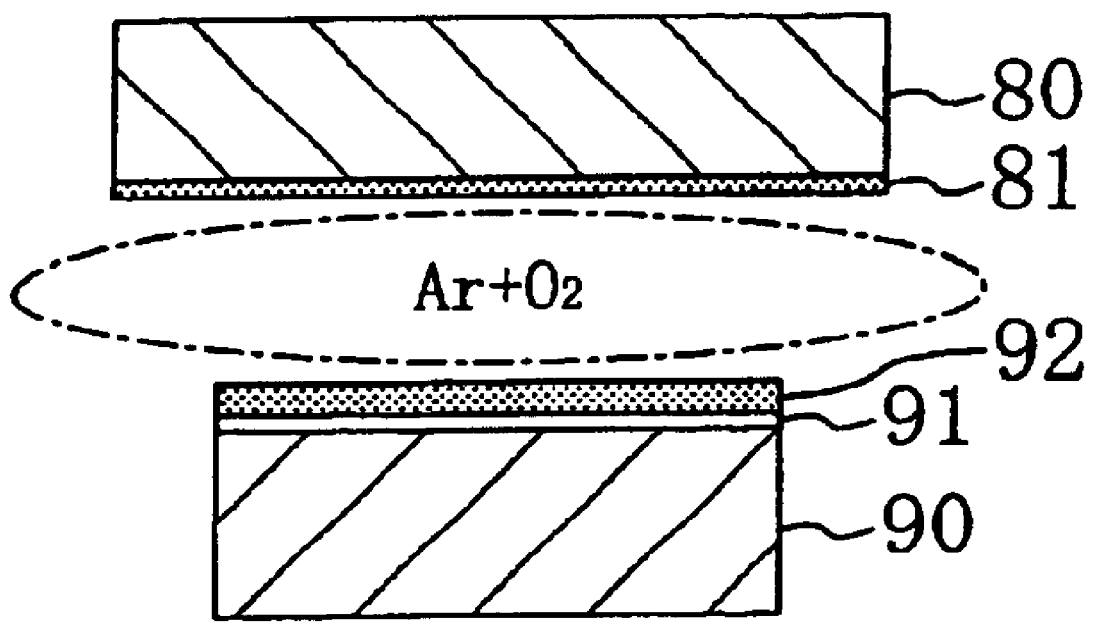
FIG. 7 is a cross-sectional view showing a known method for fabricating a semiconductor device.

FIG. 6 shows variations in flow rates of the Ar and $O_2$ gases with time and a variation in gas-discharge power for sputtering with time for an interval starting from the first Zr oxide deposition step and ending with the second Zr oxide deposition step in the method of the third embodiment.

As shown in FIG. 6, the flow rate of the Ar gas is kept constant while the first Zr oxide deposition step is being performed. However, once the first Zr oxide deposition step is over, the Ar gas is exhausted from the chamber so as to have its flow rate reduced to zero before the second Zr oxide deposition step is started. On the other hand, the $O_2$ and new Ar gases start to be introduced into the chamber after the first Zr oxide deposition step is over. Then, on and after the mixture ratio of the Ar and O₂ gases has been fixed at the start point of the second Zr oxide deposition step, the flow rates of the Ar and O₂ gases are kept constant until the second Zr oxide deposition step is over. In this case, the mixture ratio of the Ar and O₂ gases (in the steady state) is not limited to any particular value. For example, the ratio of the flow rate of the Ar gas to that of the O₂ gas may range from about 7:3 to about 1:9.

As also shown in FIG. 6, the gas-discharge power for sputtering is kept constant while each of the first or second Zr oxide deposition steps is being performed. But the gas-discharge power is kept off (i.e., reduced to zero) for the interval between the first and second Zr oxide deposition steps.

It should be noted that when the second Zr oxide deposition step is over, the Ar and O₂ gases are both exhausted from the chamber and the gas-discharge for sputtering is stopped.

According to the third embodiment, the following effects are attained as well as those obtained by the first embodiment.

Specifically, during the interval between the first and second Zr oxide deposition steps, the gas-discharge for sputtering is suspended. In the meantime, the Ar gas used for the first Zr oxide deposition step is exhausted from the chamber, and then an Ar gas is newly introduced along with the O₂ gas into the chamber. Thus, the mixture ratio of the Ar and O₂ gases should be fixed before the second Zr oxide deposition step is started. As a result, the oxygen concentration of the second Zr oxide film 33 is controllable much more easily.

For the third embodiment, the first and second Zr oxide films 32 and 33 may have the same oxygen concentration as in the first embodiment (see FIG. 3). Alternatively, as in the modified example of the first embodiment, the first and second Zr oxide films 32 and 33 may have mutually different oxygen concentrations (see FIG. 4).

Also, in the third embodiment, after the first Zr oxide deposition step is over, the new Ar gas is introduced along with the O₂ gas into the chamber. In this case, the Ar and O₂ gases may be separately introduced into the chamber and then mixed together therein. Alternatively, the Ar and O₂ gases may be pre-mixed together outside of the chamber and then introduced into the chamber. In the latter case, the mixture ratio of the Ar and O₂ gases can be fixed in a shorter time. Thus, the no discharge interval between the first and second Zr oxide deposition steps can be shortened, thereby improving the throughput of the process.

What is claimed is:

1. A semiconductor device comprising a gate insulating film that includes: a first metal oxide film deposited on a semiconductor substrate and a second metal oxide film deposited on the first metal oxide film, wherein the first and second metal oxide films are made of the same type of metal oxide, and wherein the oxygen concentration of the second metal oxide film is different from the oxygen concentration of the first metal oxide film.

2. The device of claim 1, wherein the oxygen concentration of the first metal oxide film is higher than the oxygen concentration of the second metal oxide film.

3. The device of claim 1, wherein the oxygen concentration of the first metal oxide film is lower than the oxygen concentration of the second metal oxide film.

4. The device of claim 1, wherein the first metal oxide film is formed by performing a sputtering process, in an argon gas ambient, on a target, the surface portion of the target is the metal oxide.

5. The device of claim 1, wherein the second metal oxide film is formed by performing a sputtering process, in an argon gas ambient, on a target, the surface portion of the target is the metal oxide.

6. The device of claim 1, wherein no silicon oxide film is formed between the semiconductor substrate and the first metal oxide film.

7. The device of claim 1, wherein the oxygen concentration of the second metal oxide film is uniform in the thickness direction.

8. A semiconductor device comprising a gate insulating film that includes: a first metal oxide film deposited on a semiconductor substrate; and a second metal oxide film deposited on the first metal oxide film, wherein the first and second metal oxide films are made of the same type of metal oxide, and wherein the first and second metal oxide films have the same oxygen concentrations.

9. The device of claim 8, wherein the first metal oxide film is formed by performing a sputtering process, in an argon gas ambient, on a target, the surface portion of the target is the metal oxide.

10. The device of claim 8, wherein the second metal oxide film is formed by performing a sputtering process, in an argon gas ambient, on a target, the surface portion of the target is the metal oxide.

11. The device of claim 8, wherein no silicon oxide film is formed between the semiconductor substrate and the first metal oxide film.

12. The device of claim 8, wherein the oxygen concentration of the second metal oxide film is uniform in the thickness direction.

* * * * *